(12) United States Patent
Miki et al.

(10) Patent No.: US 7,638,103 B2
(45) Date of Patent: Dec. 29, 2009

(54) PLASMA GENERATING ELECTRODE, PLASMA GENERATION DEVICE, AND EXHAUST GAS PURIFYING DEVICE

(75) Inventors: Masanobu Miki, Utsunomiya (JP); Kenji Dosaka, Shiyoa-gun (JP); Yukio Miyairi, Nagoya (JP); Yasumasa Fujioka, Nagoya (JP); Masaaki Masuda, Nagoya (JP); Tatsuhiko Hatano, Kasugai (JP); Takeshi Sakuma, Nagoya (JP); Yuuichiro Imanishi, Nagoya (JP)

(73) Assignees: NGK Insulators, Ltd., Nagoya (JP); Honda Motor Co., Ltd., Tokyo (JP)

( * ) Notice: Subject to any disclaimer, the term of this patent is extended or adjusted under 35 U.S.C. 154(b) by 796 days.

(21) Appl. No.: 10/560,858

(22) PCT Filed: Jun. 18, 2004

(86) PCT No.: PCT/JP2004/008618

§ 371 (c)(1),
(2), (4) Date: Dec. 15, 2005

(87) PCT Pub. No.: WO2004/114729

PCT Pub. Date: Dec. 29, 2004

(65) Prior Publication Data

US 2006/0196762 A1 Sep. 7, 2006

(30) Foreign Application Priority Data

Jun. 20, 2003 (JP) .............................. 2003-177233

(51) Int. Cl.
*B01J 19/08* (2006.01)

(52) U.S. Cl. ................................................ 422/186.04
(58) Field of Classification Search ............. 422/186.04
See application file for complete search history.

(56) References Cited

U.S. PATENT DOCUMENTS 6,835,358 B2 * 12/2004 Hemingway et al. ... 422/186.04

FOREIGN PATENT DOCUMENTS

| JP | A 5-115746 | 5/1993 |
| JP | A 2001-164925 | 6/2001 |
| JP | A-2001-193441 | 7/2001 |
| JP | A-2001-193442 | 7/2001 |
| JP | A 2001-274103 | 10/2001 |
| JP | A-2002-129947 | 5/2002 |

* cited by examiner

*Primary Examiner*—Kishor Mayekar
(74) *Attorney, Agent, or Firm*—Oliff & Berridge, PLC

(57) ABSTRACT

A plasma generating electrode 1 of the invention includes at least a pair of electrodes 5, at least one electrode 5a of the pair of electrodes 5 including a plate-like ceramic body 2 as a dielectric and a plurality of conductive films 3 disposed in the ceramic body 2 and each having a plurality of through-holes 4 formed through the conductive film 3 in its thickness direction in a predetermined arrangement pattern, the through-holes 4 having a cross-sectional shape including an arc shape along a plane perpendicular to the thickness direction, an arrangement pattern of the through-holes 4a formed in at least one conductive film 3a being different from an arrangement pattern of the through-holes 4b formed in the other conductive film 3b. The plasma generating electrode 1 is capable of simultaneously generating different states of plasma upon application of voltage between the pair of electrodes 5 due to the different arrangement patterns of the through-holes 4 in the conductive films 3.

14 Claims, 7 Drawing Sheets

PLASMA GENERATING ELECTRODE, PLASMA GENERATION DEVICE, AND EXHAUST GAS PURIFYING DEVICE

This application is a national stage of PCT/JP04/008618 filed Jun. 18, 2004, and claims priority to JP 2003-177233 filed Jun. 20, 2003.

TECHNICAL FIELD

The present invention relates to a plasma generating electrode, a plasma generation device, and an exhaust gas purifying device. More particularly, the present invention relates to a plasma generating electrode and a plasma generation device capable of simultaneously generating different states of plasma. The present invention also relates to an exhaust gas purifying device capable of purifying exhaust gas well.

BACKGROUND ART

It is known that silent discharge occurs when disposing a dielectric between two electrodes and applying a high alternating current voltage or a periodic pulsed voltage between the electrodes. In the resulting plasma field, active species, radicals, and ions are produced to promote reaction and decomposition of gas. This phenomenon may be utilized to remove toxic components contained in engine exhaust gas or incinerator exhaust gas.

For example, a plasma exhaust gas treatment system has been disclosed in which $NO_x$, carbon particulate, HC, and CO contained in engine exhaust gas or incinerator exhaust gas is oxidized by causing the engine exhaust gas or incinerator exhaust gas to pass through plasma (e.g. JP-A-2001-164925).

DISCLOSURE OF THE INVENTION

However, since exhaust gas contains a plurality of substances and intensity of plasma suitable for treatment differs for each substance, a plasma generating electrode designed to treat a predetermined substance cannot be used to treat another substance. This makes it necessary to provide a plurality of plasma generating electrodes when treating exhaust gas containing a plurality of substances. Moreover, since high-intensity plasma must be generated in the case of treating a plurality of substances by using one kind of plasma, power consumption is increased. A $NO_x$ reduction catalyst used for an exhaust gas purifying device such as an SCR device, which further treats a gas passed through the plasma generating electrode, reduces nitrogen dioxide ($NO_2$) into oxygen and nitrogen by using a fuel (hydrocarbon) contained in exhaust gas. However, since hydrocarbons are oxidized by high-intensity plasma, the performance of the $NO_x$ reduction catalyst is decreased.

The present invention has been achieved in view of the above-described problems and provides a plasma generating electrode and a plasma generation device capable of simultaneously generating different states of plasma. The present invention also provides an exhaust gas purifying device which includes the above plasma generation device and a catalyst and can purify exhaust gas well.

In order to achieve the above objects, the present invention provides the following plasma generating electrode, plasma generation device, and exhaust gas purifying device.

[1] A plasma generating electrode comprising at least a pair of electrodes disposed opposite to each other and capable of generating plasma upon application of voltage between the electrodes, at least one of the pair of electrodes including a plate-like ceramic body as a dielectric and a plurality of conductive films disposed inside the ceramic body without overlapping with one another and each having a plurality of through-holes formed through the conductive film in its thickness direction in predetermined arrangement patterns, the through-holes having a cross-sectional shape including an arc shape along a plane perpendicular to the thickness direction, an arrangement pattern of the through-holes formed in at least one of the conductive films being different from an arrangement pattern of the through-holes formed in the other conductive film, the plasma generating electrode being capable of simultaneously generating different states of plasma upon application of voltage between the pair of electrodes due to the different arrangement patterns of the through-holes in the conductive films (hereinafter may be called "first invention").

[2] A plasma generating electrode comprising at least a pair of electrodes disposed opposite to each other and generating plasma upon application of voltage between the electrodes, at least one of the pair of electrodes including a plate-like ceramic body as a dielectric and at least one conductive film disposed inside the ceramic body and having a plurality of through-holes formed through the conductive film in its thickness direction in two or more different arrangement patterns, the through-holes having a cross-sectional shape including an arc shape along a plane perpendicular to the thickness direction, the plasma generating electrode being capable of simultaneously generating different states of plasma upon application of voltage between the pair of electrodes due to the different arrangement patterns of the through-holes in the conductive film (hereinafter may be called "second invention").

[3] The plasma generating electrode according to [1] or [2], wherein the through-holes have a circular cross-sectional shape along a plane perpendicular to the thickness direction.

[4] The plasma generating electrode according to any of [1] to [3], wherein at least one of the conductive films includes a metal differing from that of the other conductive film as a major component.

[5] The plasma generating electrode according to any of [1] to [4], wherein the conductive film includes at least one metal selected from the group consisting of tungsten, molybdenum, manganese, chromium, titanium, zirconium, nickel, iron, silver, copper, platinum, and palladium as a major component.

[6] The plasma generating electrode according to any of [1] to [5], wherein the conductive film is disposed inside the ceramic body by screen printing, calender rolling, spraying, chemical vapor deposition, or physical vapor deposition.

[7] A plasma generation device comprising the plasma generating electrode according to any of [1] to [6] (hereinafter may be called "third invention").

[8] An exhaust gas purifying device comprising the plasma generation device according to [7] and a catalyst, the plasma generation device and the catalyst being disposed in an exhaust system of an internal combustion engine (hereinafter may be called "fourth invention").

BEST MODE FOR CARRYING OUT THE INVENTION

Embodiments of a plasma generating electrode, a plasma generation device, and an exhaust gas purifying device of the present invention are described below in detail with reference to the drawings.

Figure 1:
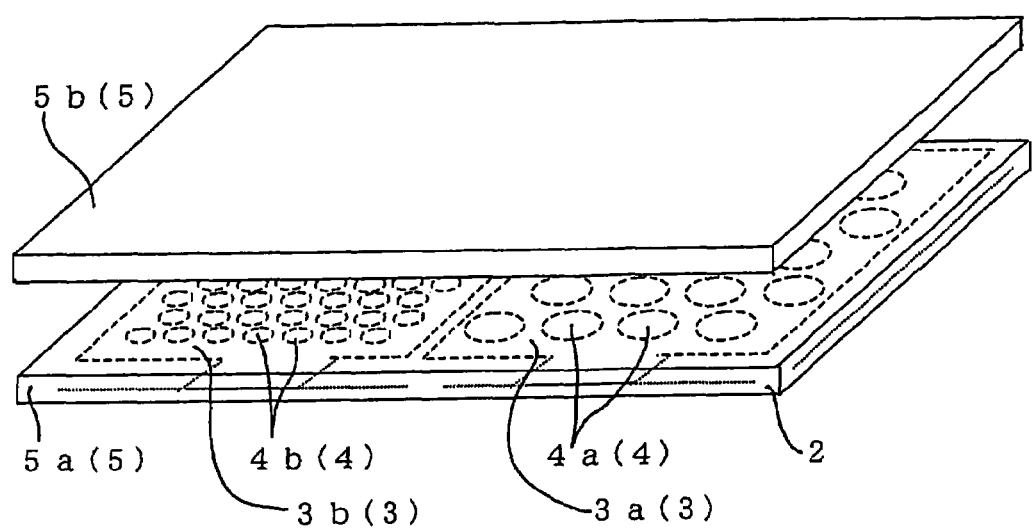
FIG. 1 is an oblique diagram schematically showing one embodiment of a plasma generating electrode of the present invention (first invention).
Figure 2:
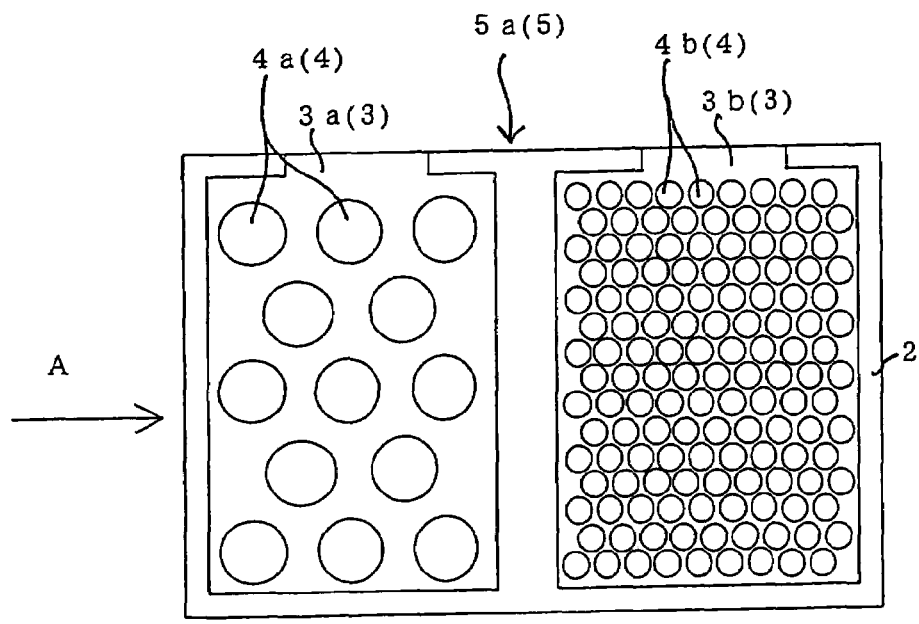
FIG. 2 is a plan view schematically showing an example of a ceramic body and a conductive film constituting an electrode in one embodiment of the plasma generating electrode of the present invention (first invention).
Figure 3:
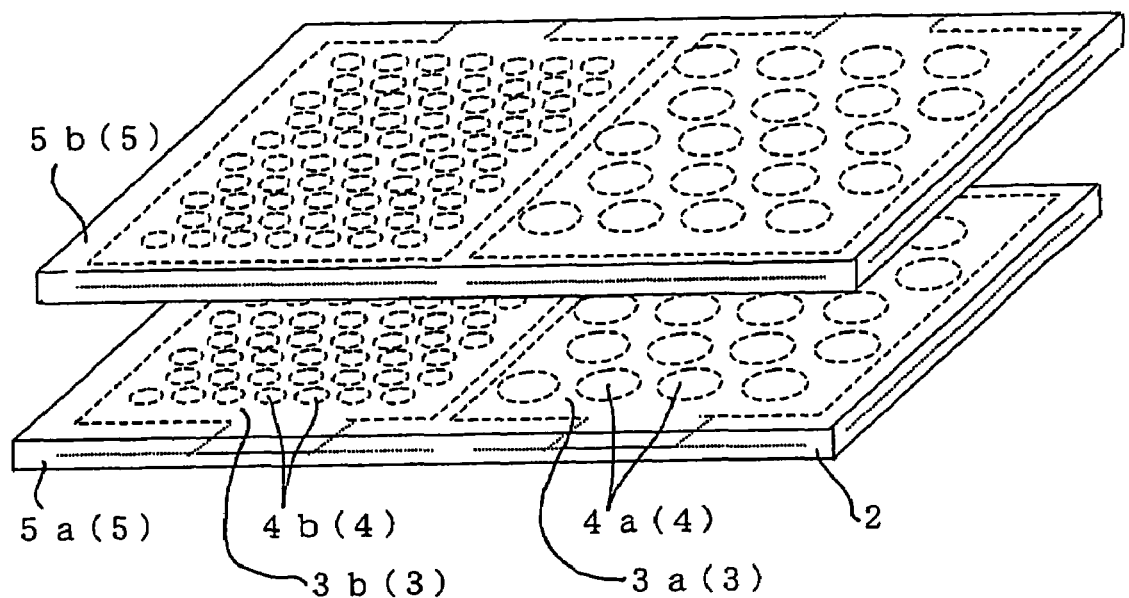
FIG. 3 is a perspective view schematically showing another embodiment of the plasma generating electrode of the present invention (first invention).

FIG. 1 is a perspective view schematically showing one embodiment of a plasma generating electrode of the present invention (first invention), and FIG. 2 is a plan view schematically showing a ceramic body and a conductive film constituting one electrode of the plasma generating electrode. As shown in FIGS. 1 and 2, a plasma generating electrode 1 of the present embodiment includes at least a pair of electrodes 5 disposed opposite to each other and can generate plasma upon application of voltage between the electrodes 5, at least one electrode 5a of the pair of electrodes 5 including a plate-like ceramic body 2 as a dielectric and a plurality of conductive films 3 disposed inside the ceramic body 2 and each having a plurality of through-holes 4 formed through the conductive film 3 in its thickness direction in a predetermined arrangement pattern, the through-holes having a cross-sectional shape including an arc shape along a plane perpendicular to the thickness direction, an arrangement pattern of the through-holes 4a formed in at least one conductive film 3a being different from an arrangement pattern of the through-holes 4b formed in another conductive film 3b, the plasma generating electrode 1 being capable of simultaneously generating different states of plasma upon application of voltage between the pair of electrodes 5 due to the different arrangement patterns of the through-holes 4 in the conductive films 3. In the present embodiment, the configuration of the other electrode 5b is not particularly limited, and known metal electrode may be used as shown in FIG. 1. As shown in FIG. 3, it is preferable that the other electrode 5b of the plasma generating electrode 1 include a plurality of conductive films each having a plurality of through-holes formed in an arrangement pattern different from those of the other conductive films in the same manner as the electrode 5a. In this case, it is preferable that connection sections for respectively supplying current to the electrode 5a and the electrodes 5b be formed in opposite directions.

In the plasma generating electrode 1 shown in FIG. 1, two electrodes 5 are disposed opposite to each other. However, the number of electrodes 5 is not limited to two. For example, three or more electrodes may be disposed in parallel so that adjacent electrodes respectively form a pair of electrodes (not shown).

FIGS. 1 and 2 illustrate the through-holes 4 having a circular cross-sectional shape along a plane perpendicular to the thickness direction. However, the cross-sectional shape of the through-holes 4 is not limited to circular and may be a shape including an arc shape such as an ellipse or a polygon having round vertices, for example.

The plasma generating electrode 1 of the present embodiment is a barrier discharge type electrode 5 including the plate-like ceramic body 2 as a dielectric and the conductive films 3 disposed inside the ceramic body 2 without overlapping with one another. The plasma generating electrode 1 may suitably be used for an exhaust gas treatment device or an exhaust gas purifying device which treats treatment target fluid such as exhaust gas by passing the treatment target fluid through plasma generated between the pair of electrodes 5 or an ozonizer which produces ozone by reacting oxygen contained in air, for example.

Since the through-holes 4 forming each arrangement pattern have a shape including an arc shape, discharge uniformly occurs at the outer periphery of the through-holes 4 as discharge starting points. Moreover, since the through-holes 4 are formed over the entire area of each conductive film 3 in a predetermined arrangement pattern, stable and uniform plasma can be generated over the entire electrode 5. If the shape of the through-hole 4 is not circular and is polygonal or the like, discharge is concentrated at locations corresponding to the vertices of the polygon so that uniform plasma cannot be generated.

The principle of printing different states of plasma simultaneously in the plasma generating electrode 1 of the present embodiment is briefly described below. The capacitance of the conductive film 3a and the capacitance of the conductive film 3b can be made different by forming an arrangement pattern of the through-holes 4a formed in the conductive film 3a in such a manner that it differ from an arrangement pattern of the through-holes 4b formed in the conductive film 3b. Different states of discharge occur between the conductive films 3a and 3b due to the difference in capacitance, so that different states of plasma can be generated. Making arrangement patterns differ between the conductive films 3 sometimes makes length of the outer periphery of the through-hole 4 per unit area differs between the conductive films 3. This also causes different discharge to occur in the conductive films 3.

In the present embodiment, it is preferable that an arrangement pattern of the through-holes 4 formed in each conductive film 3 be configured so that plasma at predetermined intensity can be generated. The intensity of plasma generated between the electrodes 5 is determined depending on the material and the capacitance of the conductive film 3, voltage applied to the electrode 5, distance between the electrodes 5a and 5b, and the like. The intensity of plasma generated on each conductive film 3 can be adjusted by causing different capacitance among the conductive films 3 by utilizing the arrangement patterns of the through-holes 4.

In the present embodiment, at least one conductive film 3a may include metal differing from that of the conductive film 3b as the major component. This enables the capacitance of the conductive film 3a and the conductive film 3b to be adjusted by utilizing the material, so that plasma at desired intensity can easily be generated by the conductive films 3a and 3b.

In the plasma generating electrode 1 of the present embodiment, electricity may be supplied to the conductive film 3a and the conductive film 3b from either a single power source or different power sources.

Figure 4:
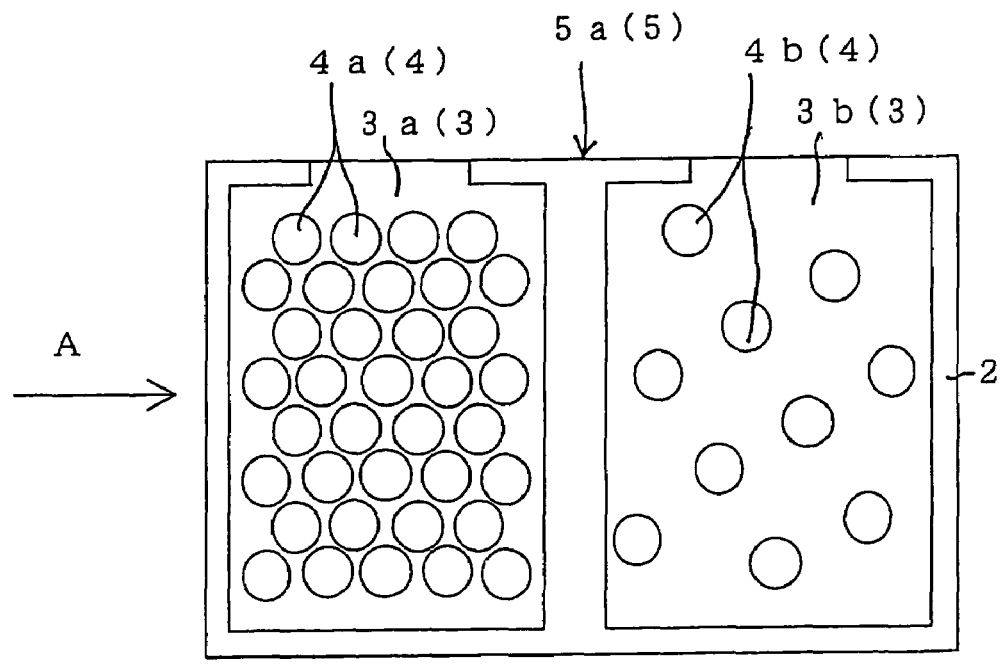
FIG. 4 is a plan view schematically showing another example of a ceramic body and a conductive film constituting one electrode in one embodiment of the plasma generating electrode of the present invention (first invention).
Figure 5:
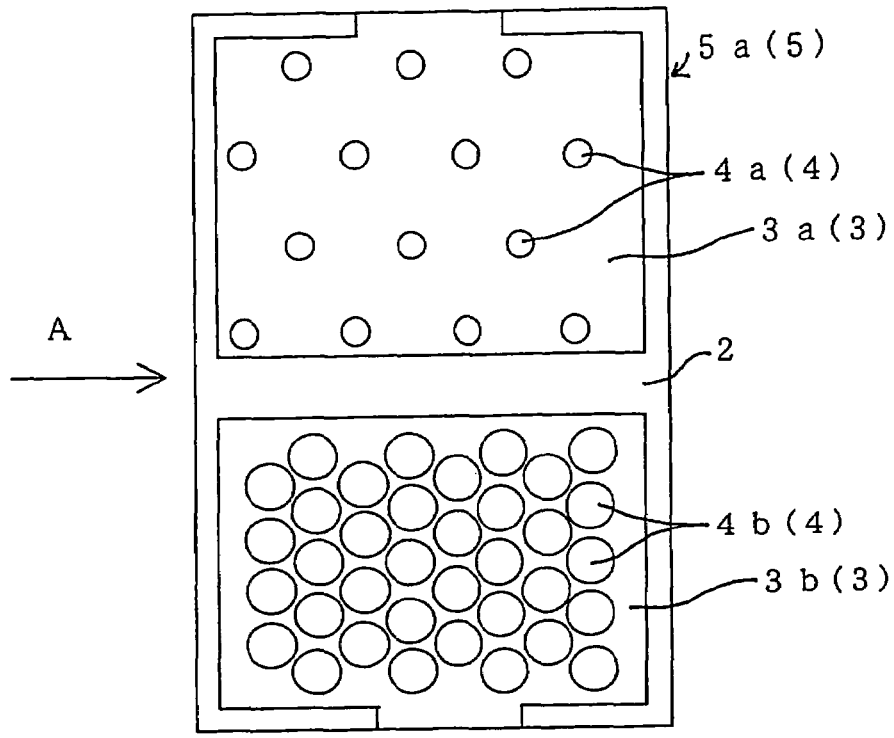
FIG. 5 is a plan view schematically showing another example of a ceramic body and a conductive film constituting one electrode in one embodiment of the plasma generating electrode of the present invention (first invention).
Figure 6:
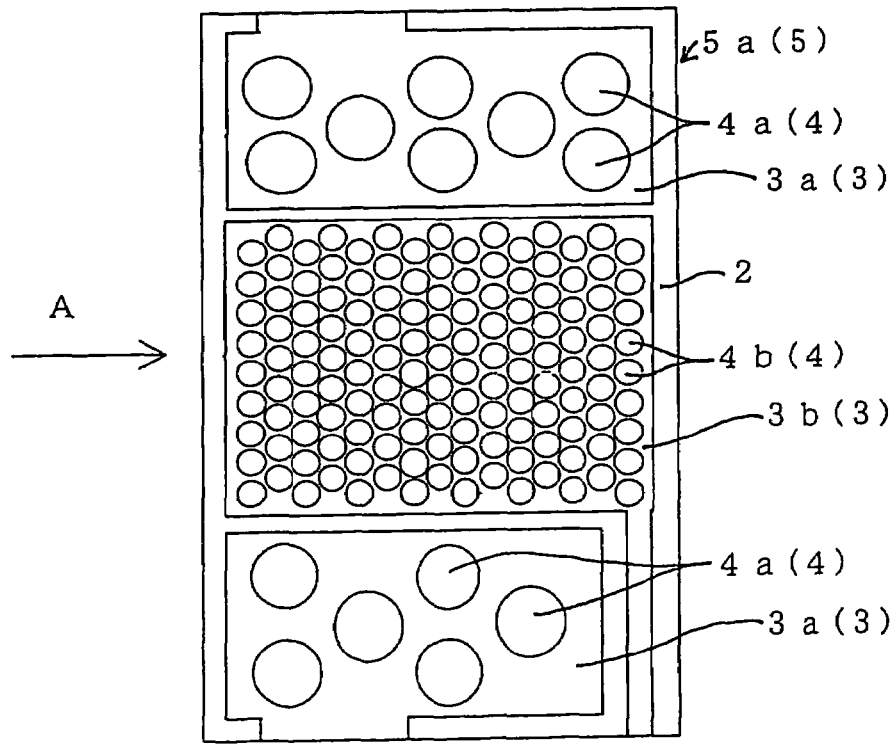
FIG. 6 is a plan view schematically showing another example of a ceramic body and a conductive film constituting one electrode in one embodiment of the plasma generating electrode of the present invention (first invention).

In FIG. 2, the electrode 5a includes two conductive films 3a and 3b and the through-holes 4a and 4b having different diameters are formed at different intervals. However, the arrangement patterns of the through-holes 4a and 4b are not limited thereto. As shown in FIG. 4, the through-holes 4a and 4b may have the same diameter, and different arrangement patterns may be formed by changing the intervals of the through-holes 4a and 4b. The arrangement positions, size, and number of the conductive films 3a and 3b are not particularly limited. As shown in FIGS. 5 to 8, through-holes 4c, 4d, and 4e may be respectively formed in conductive films 3c, 3d, and 3e at predetermined arrangement patterns, for example.

As described above, since the plasma generating electrode 1 of the present embodiment can simultaneously generate different states of plasma between a pair of electrodes 5, at the time of treating (purifying) exhaust gas discharged from an internal combustion engine such as an automotive engine, soot can be oxidized by plasma generated by the conductive film 3a, and nitrogen monoxide (NO) can be oxidized by plasma generated by the conductive film 3b.

The arrangement method for a pair of electrodes and an exhaust gas treatment process at the time of using the plasma generating electrode 1 of the present embodiment for an exhaust gas treatment device or an exhaust gas purifying device are described below. In the case of using the plasma generating electrode including the electrode 5a shown in FIGS. 2 and 4 for an exhaust gas treatment device and passing exhaust gas through the exhaust gas treatment device in the direction indicated by the arrow A, the exhaust gas can continuously be passed through different states of plasma generated by the conductive films 3a and 3b, so that a plurality of substances contained in the exhaust gas can effectively be treated. The electrode 5a shown in FIGS. 5 to 8 is configured to be suitably used to treat exhaust gas containing soot. In more detail, in the case of using the plasma generating electrode including the electrode 5a shown in FIGS. 5 and 6, plasma having high oxidizing properties capable effectively oxidizing soot is generated by the conductive film 3d, and plasma having low oxidizing properties for oxidizing a substance which is relatively easily oxidized, such as NO or CO, is generated by the conductive film 3e, for example. In the case of passing exhaust gas over the electrode 5a in the direction indicated by the arrow A, soot having a relatively large mass among the treatment target substances is drawn by plasma generated by the conductive film 3c to form a partial flow of soot in the exhaust gas flow. Soot is then oxidized by plasma generated by the conductive film 3d, and NO, CO, and the like are oxidized by plasma generated by either the conductive film 3d or the conductive film 3e. Since a region constituted by only plasma exhibiting low oxidizing properties can be formed between the pair of electrodes 5 (see FIG. 1) in the direction parallel to the exhaust gas flow direction by this constitution, the exhaust gas can be discharged in a state in which fuel (hydrocarbon) contained in the exhaust gas is not completely oxidized, that is, in a state in which the hydrocarbon is converted into aldehyde or the like. Therefore, in the case of treating exhaust gas in combination with an $NO_x$ reduction catalyst or the like, the efficiency can be improved.

Figure 7:
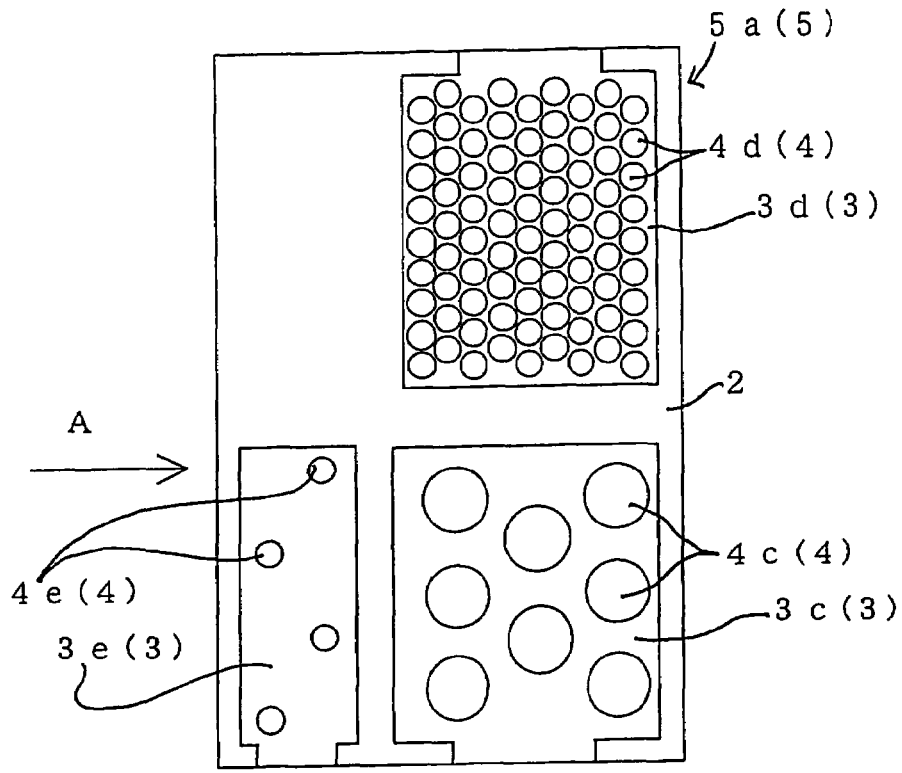
FIG. 7 is a plan view schematically showing another example of a ceramic body and a conductive film constituting one electrode in one embodiment of the plasma generating electrode of the present invention (first invention).
Figure 8:
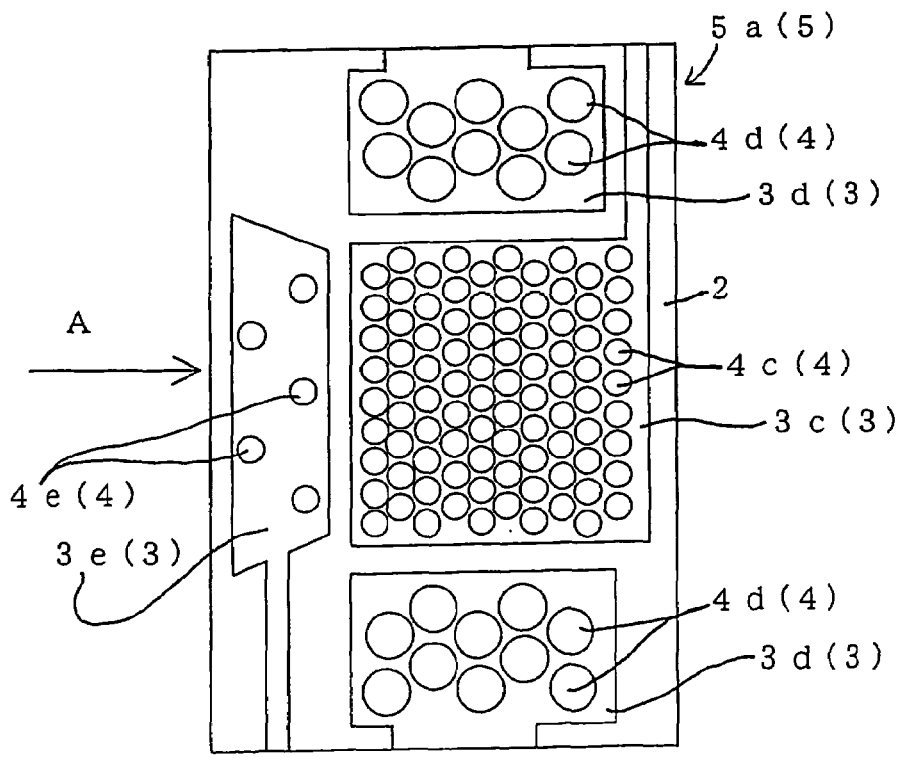
FIG. 8 is a plan view schematically showing another example of the ceramic body and a conductive film constituting one electrode in one embodiment of the plasma generating electrode of the present invention (first invention).

In the case of using the plasma generating electrode including the electrode 5a shown in FIGS. 7 and 8, a circular flow of exhaust gas is caused before passing the exhaust gas through plasma, and a partial flow of soot is formed in the exhaust gas flow by centrifugal force. Plasma exhibiting high oxidizing properties is generated in the region (i.e. conductive film 3c) in which the exhaust gas having the partial flow of soot passes, and plasma exhibiting low oxidizing properties is generated in another region (i.e. conductive film 3d), so that an effect similar to that of the case of using the electrode 5a shown in FIGS. 5 and 6 can be obtained.

It is preferable that the conductive film 3 used in the present embodiment have a thickness corresponding to 0.1 to 10% of the thickness of the ceramic body 2. This enables uniform discharge to occur on a surface of the ceramic body 2 as a dielectric. The thickness of the conductive film 3 is preferably about 5 to 50 µm in order to reduce the size of the plasma generating electrode 1 and reduce the resistance of the treatment target fluid such as exhaust gas which is passed through the space between the pair of electrodes 5. If the thickness of the conductive film 3 is less than 5 µm, reliability may be decreased in the case of forming the conductive film 3 by printing or the like. Moreover, since the resistance of the resulting conductive film 3 may be increased, the plasma generation efficiency may be decreased. If the thickness of the conductive film 3 is more than 50 µm, the resistance of the conductive film 3 is reduced. However, since the conductive film 3 having such a thickness may affect the uniformity of the surface of the ceramic body 2, it may be necessary to process the surface of the ceramic body 2 so that the surface becomes flat.

In the present embodiment of the invention, it is preferable that the conductive film 3 forming the electrode 5a be disposed inside the ceramic body 2 so that the conductive film 3 is positioned at approximately an equal distance from both the surfaces of the ceramic body 2. This enables plasma at equal intensity to be generated between the adjacent electrodes, even in the case of generating plasma in a state in which a plurality of electrodes are continuously disposed opposite to one another. When the conductive film 3 is disposed so that the conductive film 3 is positioned at different distances from both the surfaces of the ceramic body 2, the capacitance differs between the surfaces of the electrode 5a, so that the discharge characteristics may differ between the surfaces of the electrode 5a.

The conductive film 3 used in the present embodiment preferably includes metal exhibiting excellent conductivity as the major component. As preferable examples of the major component of the conductive film 3, at least one kind of metal selected from the group consisting of tungsten, molybdenum, manganese, chromium, titanium, zirconium, nickel, iron, silver, copper, platinum, and palladium can be given. In the present embodiment, the term "major component" refers to a component accounting for 60 mass % or more of the components of the conductive film 3. When the conductive film 3 contains two or more kinds of metals selected from the above-mentioned group as the major component, the total amount of the metal accounts for 60 mass % or more of the components of the conductive film 3.

As an example of a method of disposing the conductive film 3 inside the ceramic body 2, a method of embedding the conductive film 3, such as a metal plate or metal foil, in a press-formed body obtained by powder-pressing can be given. In more detail, at the time of forming a press-formed body (ceramic body) by powder-pressing, a metal plate or metal foil containing the above-mentioned metal as the major component is embedded so that the metal plate or metal foil is positioned at an equal distance (distance in the thickness direction) from both the surfaces of the press-formed body. Since the embedded metal foil or the like may be deformed or cut due to sintering shrinkage of the ceramics, it is preferable to sinter the press-formed body so that mass transfer is suppressed in the horizontal (planar) direction. By this constitutions, the press-formed body may be sintered while applying pressure to the press-formed body in its thickness direction.

The conductive film 3 may be applied to the ceramic body 2. As suitable examples of the application method, screen printing, calender rolling, dip coating, chemical vapor deposition, and physical vapor deposition, can be given. According to these methods, the conductive film 3 exhibiting excellent surface flatness and smoothness after application and having a small thickness can easily be formed. Among the above-mentioned methods, chemical vapor deposition and physical vapor deposition may increase cost. However, these methods enable a thinner conductive film to be easily disposed and through-holes having a smaller diameter and a smaller center-to-center distance to be easily formed.

At the time of applying the conductive film 3 to the ceramic body 2, powder of the metal mentioned above as the major component of the conductive film 3, an organic binder, and a solvent such as terpineol may be mixed together to form a conductive paste, and the conductive paste may be applied to the ceramic body 2 by using the above-mentioned method. An additive may optionally be added to the conductive paste in order to improve adhesion to the ceramic body 2 and improve sinterability.

The adhesion between the conductive film 3 and the ceramic body 2 can be improved by adding the same component as the component of the ceramic body 2 to the metal component of the conductive film 3. A glass component may be added to the ceramic component added to the metal component. The addition of the glass component improves the sinterability of the conductive film 3 so that the density of the conductive film 3 is improved in addition to adhesion. The total amount of the component of the ceramic body 2 and/or the glass component other than the metal component is preferably 30 mass % or less. If the total amount exceeds 30 mass %, the function of the conductive film 3 may not obtained due to decrease in resistance.

The ceramic body 2 of the present embodiment has a function as a dielectric as described above. By using the conductive film 3 in a state in which the conductive film 3 is held inside the ceramic body 2, local discharge such as a spark is reduced and small discharge can be caused at multiple locations in comparison with the case of causing discharge by using the conductive film 3 alone. Since such small discharge causes a small amount of current to flow in comparison with discharge such as a spark, power consumption can be reduced. Moreover, a current which flows between the electrodes 5 is limited due to the presence of the dielectric, so that non-thermal plasma which does not cause a rise in temperature and consumes only a small amount of energy can be generated.

The ceramic body 2 used in the present embodiment preferably includes a material having a high dielectric constant as the major component. As the material for the ceramic body 2, aluminum oxide, zirconium oxide, silicon oxide, titanium-barium type oxide, magnesium-calcium-titanium type oxide, barium-titanium-zinc type oxide, silicon nitride, aluminum nitride, or the like may suitably be used. The plasma generating electrode 1 can be operated at high temperature by using a material exhibiting excellent thermal shock resistance as the major component of the ceramic body 2.

The thickness of the ceramic body 2 is preferably 0.1 to 3 mm, although the thickness of the ceramic body 2 is not particularly limited. If the thickness of the ceramic body 2 is less than 0.1 mm, it may be difficult to ensure electric insulating properties of the electrode 5. If the thickness of the ceramic body 2 is more than 3 mm, reduction in size of an exhaust gas purifying system may be hindered. Moreover, the applied voltage must be increased due to an increase in the electrode-to-electrode distance, whereby the efficiency may be decreased.

As the ceramic body 2 used in the embodiment, a ceramic green sheet for a ceramic substrate may suitably be used. The ceramic green sheet may be obtained by forming slurry or paste for a green sheet to have a predetermined thickness by using a conventionally known method such as a doctor blade method, a calender method, a printing method, or a reverse roll coating method. The resulting ceramic green sheet may be subjected to cutting, grinding, punching, or formation of communicating opening, or may be used as an integral laminate in which the green sheets are layered and bonded by thermocompression bonding or the like.

As slurry or paste for a green sheet, a mixture prepared by mixing an appropriate binder, sintering agent, plasticizer, dispersant, organic solvent, and the like into a predetermined ceramic powder may suitably be used. As suitable examples of the ceramic powder, alumina, mullite, ceramic glass, zirconia, cordierite, silicon nitride, aluminum nitride, and glass can be given. As suitable examples of the sintering agent, silicon oxide, magnesium oxide, calcium oxide, titanium oxide, and zirconium oxide can be given. The sintering agent is preferably added in an amount of 3 to 10 parts by mass for 100 parts by mass of the ceramic powder. As the plasticizer, dispersant, and organic solvent, those used for a conventionally known method may suitably be used.

As the ceramic body 2 used in the present embodiment, a ceramic sheet formed by extrusion may also suitably be used. For example, a plate-like ceramic formed body obtained by extruding a mixture prepared by mixing the above-mentioned ceramic powder with a forming agent such as methyl cellulose, a surfactant, and the like through a predetermined die may be used.

In the present embodiment, the porosity of the ceramic formed body 2 is preferably 0.1 to 35%, and more preferably 0.1 to 10%. This allows plasma to be efficiently generated between the electrode 5a including the ceramic body 2 and the electrode 5b disposed opposite to the electrode 5a, so that energy saving can be realized.

It is preferable that the pair of electrodes 5 be disposed at such a distance that plasma can effectively be generated therebetween. The electrodes 5 are preferably disposed at a distance of 0.1 to 5 mm although the distance may differ depending on the voltage applied to the electrodes or the like.

A method of manufacturing the plasma generating electrode of the present embodiment is described below in detail.

First, a ceramic green sheet used as the above ceramic body is provided. For example, the aforementioned sintering agent, a binder such as a butyral resin or a cellulose resin, a plasticizer such as DOP or DBP, an organic solvent such as toluene or butadiene, and the like are added to at least one kind of material selected from the group consisting of alumina, mullite, ceramic glass, and glass. The components are sufficiently mixed by using an alumina pot and an alumina ball to prepare a green sheet slurry. A green sheet slurry may be prepared by mixing the materials by ball milling using a mono ball.

The resulting green sheet slurry is stirred under reduced pressure for degassing and adjusted to have a predetermined viscosity. The green sheet slurry is formed in the shape of a tape by using a tape forming method such as a doctor blade method to form an unfired ceramic body.

A conductive paste for forming a conductive film disposed on one surface of the unfired ceramic body is provided. The conductive paste may be prepared by adding a binder and a solvent such as terpineol to silver powder and sufficiently kneading the mixture by using a triroll mill, for example.

The resulting conductive paste is printed on a surface of the unfired ceramic body by screen printing or the like to form conductive films. At this time, the conductive paste is printed so that through-holes are formed in the conductive films in different arrangement patterns. In order to supply electricity to the conductive films from the outside after holding the conductive films inside the unfired ceramic body, the conductive paste is preferably printed so that each conductive film extends to the outer periphery of the unfired ceramic body.

At the time of forming the conductive films by printing the conductive paste, the conductive films having different through-hole arrangement patterns may be formed by either simultaneously or separately printing the conductive paste. Different types of conductive paste may be printed so that the conductive films contain different major components.

Another unfired ceramic formed body is layered on the unfired ceramic body on which the conductive films are printed so that the printed conductive films are covered. The unfired ceramic formed bodies are preferably layered at a temperature of 100° C. while applying a pressure of 10 MPa.

Then, the resulting laminate is fired to form an electrode including a plate-like ceramic body as a dielectric and conductive films disposed inside the ceramic body without overlapping with one another.

An electrode as a counter electrode is disposed opposite to the resulting electrode to form a plasma generating electrode of the present embodiment. As the electrode used as the counter electrode, an electrode obtained by using the above-described manufacturing method or an electrode having a conventionally known configuration may be used.

Figure 9:
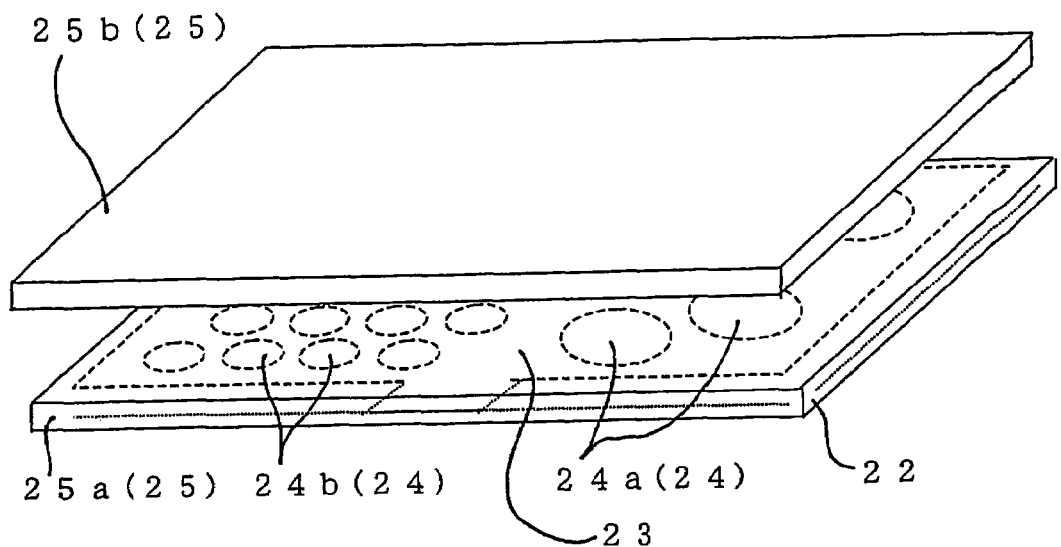
FIG. 9 is a perspective view schematically showing one embodiment of a plasma generating electrode of the present invention (second invention).
Figure 10:
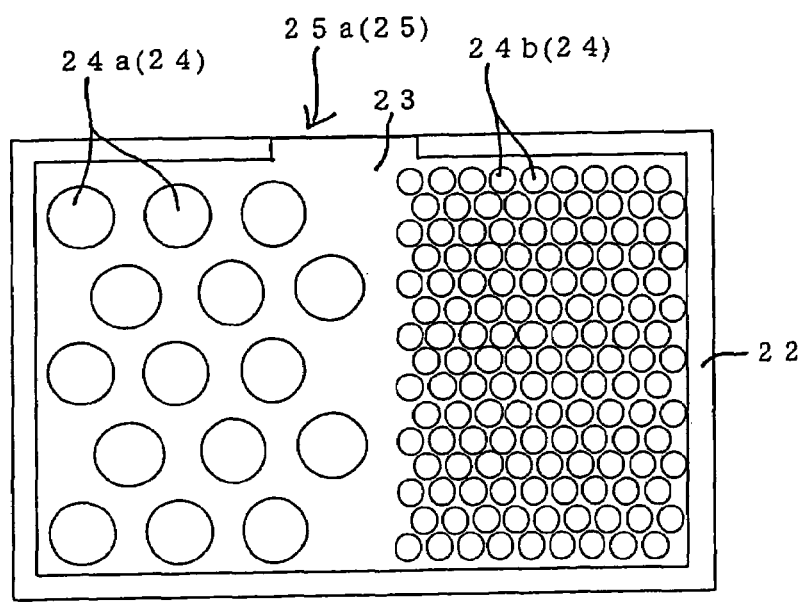
FIG. 10 is a plan view schematically showing an example of a ceramic body and a conductive film constituting one electrode in one embodiment of the plasma generating electrode of the present invention (second invention).

One embodiment of a plasma generating electrode of the present invention (second invention) is described below. As shown in FIGS. 9 and 10, a plasma generating electrode 21 of the present embodiment includes at least a pair of electrodes 25 disposed opposite to each other and generates plasma upon application of voltage between the electrodes 25, at least one electrode 25a of the pair of electrodes 25 including a plate-like ceramic body 22 as a dielectric and a conductive film 23 disposed inside the ceramic body 22 and having a plurality of through-holes 24 formed through the conductive film 23 in its thickness direction in two or more different arrangement patterns, the through-holes 24 having a cross-sectional shape including an arc shape along a plane perpendicular to the thickness direction, the plasma generating electrode 21 being capable of simultaneously generating different states of plasma upon application of voltage between the pair of electrodes 25 due to the different arrangement patterns of the through-holes 24a and 24b in the conductive film 23.

In the plasma generating electrode 21 of the present embodiment, the through-holes 24a and 24b are formed in one conductive film 23 in two or more different arrangement patterns, differing from the first invention in which one electrode includes a plurality of conductive films. The configuration in which the through-holes 24a and 24b are formed in different arrangement patterns allows different discharge to occur due to the different arrangement patterns, so that different states of plasma can be generated.

Since the plasma generating electrode 21 of the present embodiment can simultaneously generate different states of plasma between the electrodes 25, at the time of treating exhaust gas discharged from an automotive engine, soot can be oxidized by plasma generated in the region in which the through-holes 24a are formed in one arrangement pattern, and nitrogen oxide (e.g. NO) can be oxidized by plasma generated in the region in which the through-holes 24b are formed in another arrangement pattern. Therefore, an effect similar to that of the plasma generating electrode of the first invention can be obtained.

As the conductive film 23 constituting the plasma generating electrode 21 of the present embodiment, a conductive film configured in the same manner as the conductive film described in to one embodiment of the first invention may suitably be used, except that the through-holes 24a and 24b formed through the thickness direction of the conductive film 23 and having a cross-sectional shape including an arc shape along a plane perpendicular to the thickness direction are formed in two or more different arrangement patterns. FIGS. 9 and 10 illustrate the through-holes 24a and 24b having a circular cross-sectional shape along a plane perpendicular to the thickness direction. However, the cross-sectional shape of the through-holes 24a and 24b is not limited to a circle, but may be an ellipse, a shape in which a polygon has the rounded vertice, or the like. The conductive film 23 may be formed by using a method similar to the method described in one embodiment of the first invention except for forming the through-holes 24a and 24b in two or more different arrangement patterns. As the ceramic body 22 constituting the plasma generating electrode 21 of the present embodiment, a ceramic body configured in the same manner as the ceramic body described in one embodiment of the first invention may suitably be used.

FIG. 10 shows two arrangement patterns in which the through-holes 24a and 24b having different diameters are arranged at different intervals. However, the arrangement patterns of the through-holes 24a and 24b are not limited thereto. The arrangement patterns may be made different by disposing the through-holes 24a and 24b having the same diameter at different intervals (not shown). The number of arrangement patterns is not limited to two as long as it is two or more.

Figure 11A:
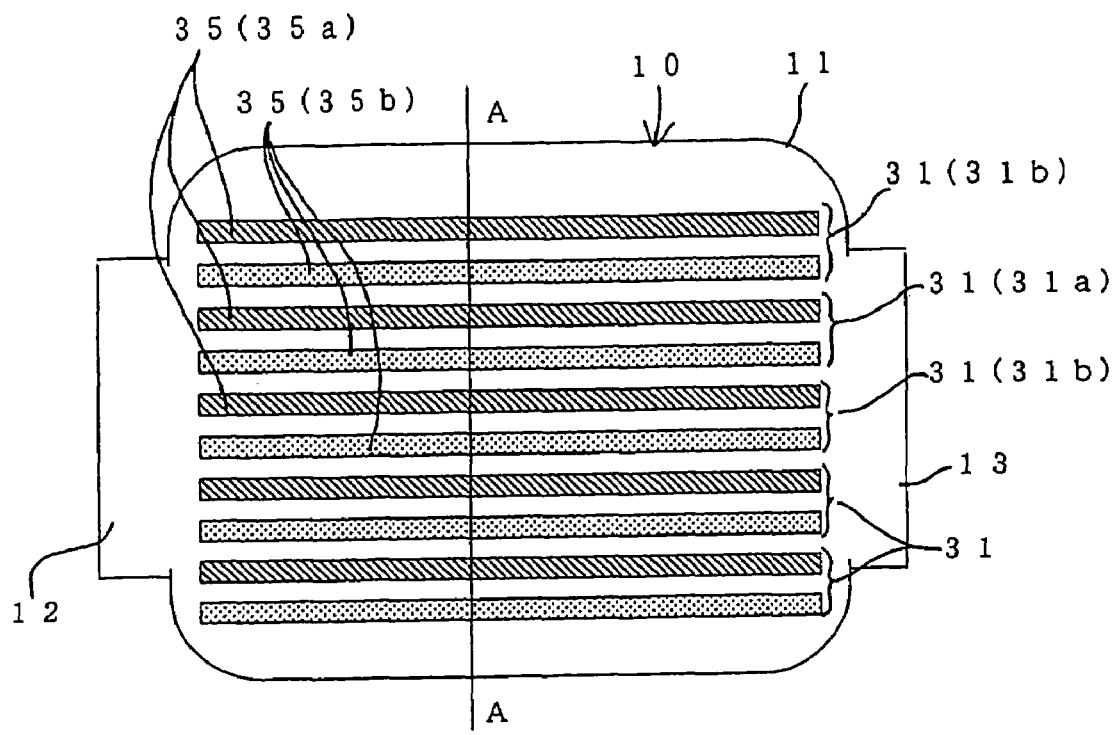
FIG. 11(a) is a cross-sectional view showing one embodiment of a plasma generation device of the present invention (third invention) along a plane including the treatment target fluid flow direction.
Figure 11B:
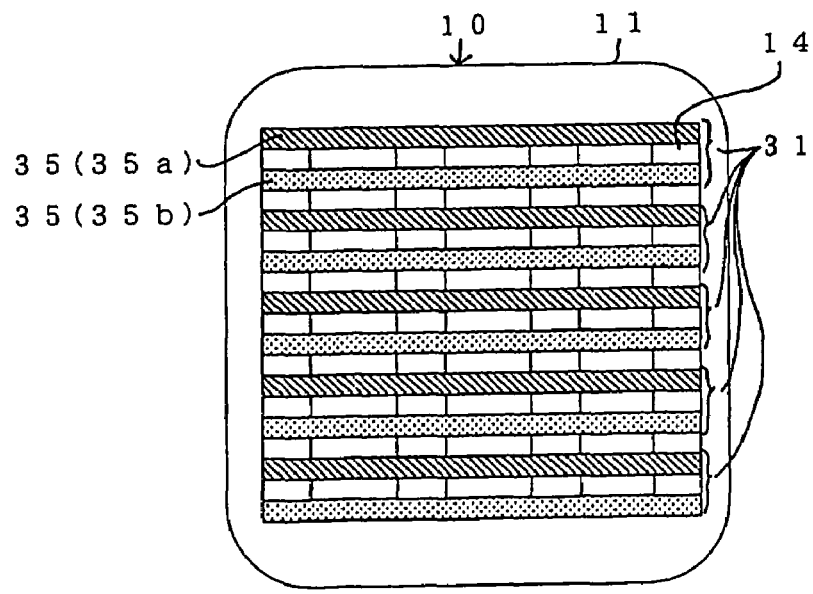
FIG. 11(b) is a cross-sectional view along the line A-A shown in FIG. 11(a).

One embodiment of a plasma generation device of the present invention (third invention) is described below. As shown in FIGS. 11(a) and 11(b), a plasma generation device 10 of the present embodiment includes the plasma generating electrode 1 according to the first or second invention. In more detail, the plasma generation device 10 of the present embodiment includes a plasma generating electrode 31 and a casing 11 which accommodates a pair of electrodes 35 constituting the plasma generating electrode 10 in a state in which a treatment target fluid such as exhaust gas can pass through the space between a pair of electrodes 35. The casing 11 includes an inlet port 12 through which the treatment target fluid flows, and an outlet port 13 through which the treated fluid obtained by treating the treatment target fluid by passing the fluid through the space between the electrodes 35 is discharged.

Since the plasma generation device 10 of the present embodiment includes the plasma generating electrode 31 of the first or second invention, the plasma generation device 10 can simultaneously generate different types of plasma by applying voltage between the pair of electrodes 35 due to the different arrangement patterns of the through-holes in the conductive film(s).

As shown in FIGS. 11(a) and 11(b), in the plasma generation device 10 according to the present embodiment, it is preferable that the plasma generating electrodes 31 each having a pair of electrodes 35 be disposed in layers inside the casing 11. FIGS. 11(a) and 11(b) illustrate a state in which five plasma generating electrodes 31 each constituted by a pair of electrodes 5 are layered for convenience of illustration. However, the number of plasma generating electrodes 31 to be layered is not limited thereto. The plasma generating electrode 31 may be configured to include a plurality of electrodes. Spacers 14 are disposed between the pair of electrodes 35 constituting the plasma generating electrode 31 and between the plasma generating electrodes 31 in order to form a predetermined gap.

The plasma generation device 10 configured as described above may be installed in an automotive exhaust system, for example. In this case, exhaust gas discharged from an engine or the like is passed through plasma generated between the pair of electrodes 5 so that toxic substances such as soot and nitrogen oxide contained in the exhaust gas are reacted and discharged to the outside as a nonhazardous gas.

At the time of layering two or more plasma generating electrodes 31, it is preferable to configure the plasma generation device 10 so that plasma can also be generated between the layered plasma generating electrodes 31. Specifically, it is preferable to configure the plasma generation device 10 so that discharge occurs not only between the electrode 35a of the electrode 35 constituting the plasma generating electrode 31a and the electrode 35b disposed opposite to the electrode 35a, but also between the electrode 35a of the electrode 35 constituting the plasma generating electrode 31a and the electrode 35b constituting the adjacent plasma generating electrode 31b, such that plasma can be generated between the layered plasma generating electrodes 31.

The plasma generation device of the present embodiment may include a power source for applying voltage to the plasma generating electrode (not shown). As the power source, a conventionally known power source which can supply electricity so that plasma can effectively be generated may be used.

The plasma generation device of the present embodiment may be configured so that current is supplied from an external power source instead of providing a power source in the plasma generation device as described above.

Current supplied to the plasma generating electrode used in the present embodiment may appropriately be selected depending on intensity of plasma to be generated. When installing the plasma generation device in an automotive exhaust system, it is preferable that current supplied to the plasma generating electrode be a direct current at a voltage of 1 kV or more, a pulsed current having a peak voltage of 1 kV or more and a pulse rate per second of 100 or more (100 Hz or more), an alternating current having a peak voltage of 1 kV or more and a frequency of 100 Hz or more, or a current generated by superimposing two of these currents. This constitution enables efficient generation of plasma.

Figure 12:
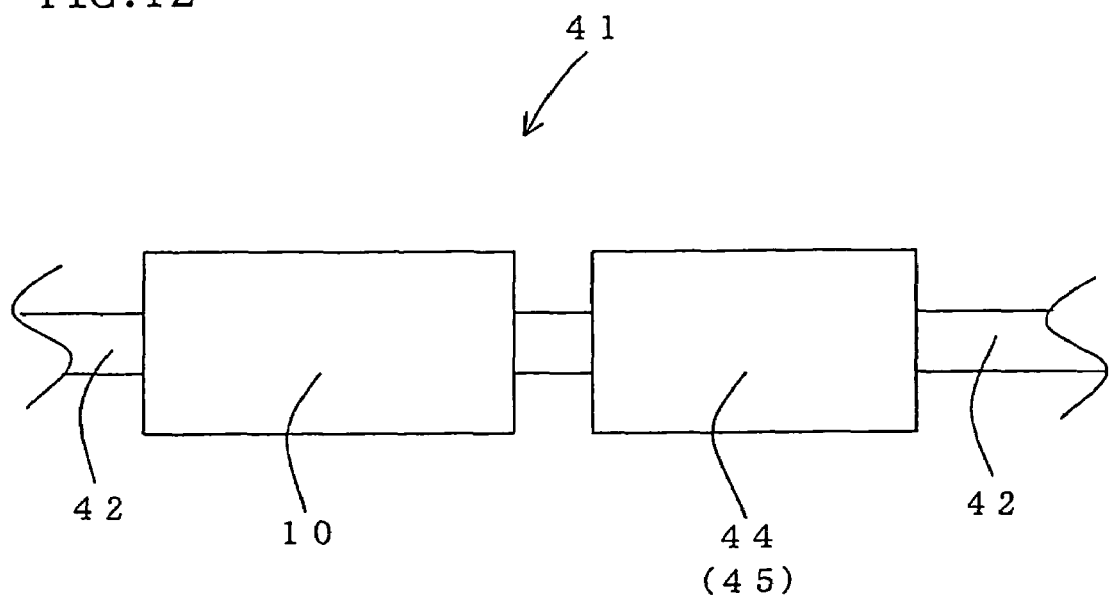
FIG. 12 is an explanatory view schematically showing one embodiment of an exhaust gas purifying device of the invention (fourth invention).

Next, one embodiment of an exhaust gas purifying device of the present invention (fourth invention) is described below in detail. FIG. 12 is an explanatory view schematically showing an exhaust gas purifying device of the present embodiment. As shown in FIG. 12, an exhaust gas purifying device 41 of the present embodiment includes the plasma generation device 10 of one embodiment of the third invention and a catalyst 44, the plasma generation device 10 and the catalyst 44 being provided in an exhaust system of an internal combustion engine. The plasma generation device 10 is provided on the exhaust gas generation side (upstream) of the exhaust system, and the catalyst 44 is provided on the exhaust side (downstream). The plasma generation device 10 and the catalyst 44 are connected through a pipe 42.

The exhaust gas purifying device 41 of the present embodiment is a device which purifies $NO_x$ contained in exhaust gas under oxygen-rich atmosphere, for example. That is, $NO_x$ is reformed by plasma generated by the plasma generation device so that $NO_x$ is easily purified by the downstream catalyst 44, or a hydrocarbon (HC) or the like in the exhaust gas is reformed so that HC easily reacts with $NO_x$, and $NO_x$ is purified by the catalyst 44.

The plasma generation device 10 used for the exhaust gas purifying device 41 of the present embodiment converts $NO_x$ contained in exhaust gas generated by combustion is oxygen-rich atmosphere, such as in a lean burn or gasoline direct injection engine or a diesel engine, into $NO_2$ by plasma. The plasma generation device 10 generates active species from HC or the like contained in exhaust gas. As the plasma generation device 10, a plasma generation device configured in the same manner as the plasma generation device 10 shown in FIG. 11(a) may suitably be used.

The catalyst 44 is provided downstream of the plasma generation device 10 in the exhaust system as a catalyst unit 45 provided with a catalytic member including a substrate having pores through which exhaust gas is circulated are formed. The catalytic member includes the substrate and a catalyst layer formed to cover the inner wall surfaces surrounding the pores in the substrate.

Since the catalyst layer is generally formed by impregnating the substrate with a catalyst in a slurry form (catalyst slurry) as described later, the catalyst layer may be called a "washcoat (layer)".

The shape of the substrate is not particularly limited insofar as the substrate has an exhaust gas circulation space. In the present embodiment, a honeycomb-shaped support having a plurality of minute holes is used.

It is preferable that the substrate be formed of a material exhibiting heat resistance. As examples of such a material, a porous material (ceramic) such as cordierite, mullite, silicon carbide (SiC), and silicon nitride ($Si_3N_4$), a metal (e.g. stainless steel) and the like can be given.

The catalyst layer is mainly formed by a porous carrier and one or more elements selected from Pt, Pd, Rh, Au, Ag, Cu, Fe, Ni, Ir, and Ga supported on the surface of the porous carrier. Pores continuous with the pores in the substrate are formed in the catalyst layer.

The porous carrier may appropriately be formed of a material selected from alumina, zeolite, silica, titania, zirconia, silica-alumina, ceria, and the like. As the catalyst 44, a catalyst which promotes decomposition of $NO_x$ is used.

The present invention is described below in more detail by way of examples. However, the present invention should not be construed as being limited to the following examples.

Example 1

A plasma generation device having a configuration as shown in FIG. 11(a) was manufactured. Exhaust gas was treated by using the plasma generation device, and the amounts of soot, nitrogen monoxide (NO), and hydrocarbon (HC) contained in the gas after the treatment were measured, and the presence or absence of aldehyde was determined. A plasma generating electrode used in the plasma generation device of this example was manufactured as follows. The first conductive film having through-holes formed in such an arrangement pattern that the diameter of the through-holes was 2 mm and the interval between the adjacent through-holes was 8 mm, and the second conductive film, having through-holes formed in such an arrangement pattern that the diameter of the through-holes was 5 mm and the interval between the adjacent through-holes was 6 mm were screen-printed on an unfired alumina tape substrate (thickness after firing: 0.5 mm) by using a tungsten paste to a thickness of 10 μm. At this time, the first conductive film and the second conductive film were disposed in series on the exhaust gas inlet side and the exhaust gas outlet side, respectively. After laminating an alumina tape on the resulting product, the laminate was fired to form an electrode including a plate-like ceramic body as a dielectric and the first and second conductive films disposed inside the ceramic body and having different two kinds of arrangement patterns. 10 electrodes were formed and layered with 1 mm gap between each electrode so that the electrodes were disposed opposite to one another to form a plasma generating electrode. The conductive films constituting each electrode were alternately connected with power source lines. A pulse power source using an SI thyristor was connected with one of the power source lines, and the other power source line was grounded.

When pulsed current was caused to flow through each conductive film at a voltage of 5 kV, an energy of 25 mJ per pulse was supplied to the conductive film having the arrangement pattern with a diameter of 2 mm and an interval of 8 mm, and an energy of 10 mJ per pulse was supplied to the conductive film having the arrangement pattern with a diameter of 5 mm and an interval of 6 mm. It is considered that the difference in energy supplied is caused by the difference in capacitance due to the difference in the arrangement pattern between the conductive films. A uniform and excellent discharge state was obtained for both of the conductive films irrespective of the amount of energy supplied.

Exhaust gas simulating exhaust gas discharged from an engine was passed through the plasma generation device. As the exhaust gas, a gas prepared by mixing 1000 mg/hr of soot into a mixed gas containing 10 vol % of oxygen, 10 vol % of $CO_2$, 200 ppm of propylene, and 200 ppm of NO gas, with the balance being nitrogen, was used. The concentration of each component contained in the gas after passing through plasma was measured. The measurement results are shown in Table 1.

TABLE 1

|  |  | Example 1 | Example 2 | Example 3 | Comparative Example 1 | Comparative Example 2 |
|---|---|---|---|---|---|---|
| Voltage (kV) | First conductive film | 5 | 5 | 8 | 8 | 4 |
|  | Second conductive film | 5 | 5 | 4 |  |  |
| Number of pulses (pulse/sec) | First conductive film | 500 | 100 | 100 | 100 | 1000 |
|  | Second conductive film | 500 | 1000 | 1000 |  |  |
|  | Amount of NO (ppm) | 60 | 40 | 50 | 120 | 60 |
|  | Amount of HC (ppmC) | 80 | 50 | 60 | 100 | 100 |
|  | Aldehyde | Present | Present | Present | Present | Present |
|  | Amount of PM (mg/hr) | 50 | 60 | 30 | 50 | 900 |

Example 2

A 5 kV pulsed current was caused to flow through a plasma generation device configured in the same manner as the plasma generation device of Example 1 so that the number of pulses applied to the first conductive film was 100 pulse/sec and the number of pulses applied to the second conductive film was 1000 pulse/sec. Measurements were conducted in the same manner as described above. The measurement results are shown in Table 1.

Example 3

A plasma generation device configured in the same manner as the plasma generation device of Example 1 was provided. An 8 kV pulsed current was caused to flow through the first conductive film so that the number of pulses was 100 pulse/sec, and a 4 kV pulsed current was caused to flow through the second conductive film so that the number of pulses was 1000 pulse/sec. Measurements was conducted in the same manner as described above. The measurement results are shown in Table 1.

Comparative Example 1

A pulsed current was caused to flow through a plasma generation device configured in the same manner as the plasma generation device of Example 1, except for using an electrode in which only the first conductive film was formed, at a voltage of 8 kV so that the number of pulses was 100 pulse/sec. Measurement was conducted in the same manner as described above. The measurement results are shown in Table 1.

Comparative Example 2

A pulsed current was caused to flow through a plasma generation device configured in the same manner as the plasma generation device of Example 1, except for using an electrode in which only the second conductive film was formed, at a voltage of 4 kV so that the number of pulses was 1000 pulse/sec. Measurement was conducted in the same manner as described above. The measurement results are shown in Table 1.

As shown in Table 1, in the plasma generation devices of Examples 1 to 3, soot and NO were effectively oxidized, and aldehyde, which can improve the performance of the $NO_x$ reduction catalyst, was produced. The plasma generation device of Comparative Example 1 and the plasma generation device of Comparative Example 2 could not effectively treat soot and NO due to low NO treatment capability and low soot treatment capability, respectively.

Example 4

An exhaust gas purifying device was manufactured by disposing a catalyst downstream of the plasma generation device of Example 1. The $NO_x$ purification-performance of the exhaust gas purifying device was evaluated. As the catalyst, a catalyst powder prepared by impregnating commercially-available $\gamma\text{-}Al_2O_3$ with 5 mass % of Pt was supported on a cordierite ceramic honeycomb. The honeycomb catalyst was in the shape of a cylinder having a diameter of 105.7 mm and a length of 114.3 mm. The number of cells was 400, and the thickness (rib thickness) of the partition walls partitioning the cells was 4 mil (about 0.1 mm). The plasma generation conditions and the gas conditions were the same as those of Example 1.

As a result, the $NO_x$ concentration was reduced to 110 ppm after the mixed gas having an NO concentration of 200 ppm had passed through the plasma generation device and the catalyst.

Comparative Example 3

An exhaust gas purifying device was manufactured by disposing a catalyst similar to that used in Example 4 downstream of the plasma generation device of Comparative Example 1. The $NO_x$ purification performance of the exhaust gas purifying device was evaluated. The plasma generation conditions and the gas conditions were the same as those of Comparative Example 1.

As a result, the $NO_x$ concentration was reduced little to 170 ppm after NO of 200 ppm had passed through the plasma generation device and the catalyst.

INDUSTRIAL APPLICABILITY

Since a plasma generating electrode and a plasma generation device of the present invention can simultaneously generate different states of plasma, the plasma generating electrode and the plasma generation device can suitably be used for a purification device which purifies exhaust gas containing a plurality of substances, for example. Since the exhaust gas purifying device of the present invention includes the above plasma generation device and a catalyst, the exhaust gas purifying device can suitably be used as a purifying device which purifies exhaust gas discharged from an automotive engine or the like.

The invention claimed is:

1. A plasma generating electrode comprising at least a pair of electrodes disposed opposite to each other and capable of generating plasma upon application of voltage between the electrodes, at least one of the pair of electrodes including a plate-shaped ceramic body as a dielectric and a plurality of conductive films disposed inside the ceramic body without overlapping with one another and each conductive film of the plurality of conductive films having a plurality of through-holes formed through the conductive film in its thickness direction in a predetermined arrangement pattern, the through-holes having a cross-sectional shape including an arc shape along a plane perpendicular to the thickness direction, the arrangement pattern of the through-holes formed in at least one of the conductive films being different from the arrangement pattern of the through-holes formed in another of the conductive films, the plasma generating electrode being capable of simultaneously generating different states of plasma upon application of voltage between the pair of electrodes due to the different arrangement patterns of the through-holes in the conductive films of the at least one of the pair of electrodes.

2. The plasma generating electrode according to claim 1, wherein the through-holes have a circular cross-sectional shape along the plane perpendicular to the thickness direction.

3. The plasma generating electrode according to claim 1, wherein at least one of the conductive films includes a metal differing from that of another conductive film as a major component.

4. The plasma generating electrode according to claim 1, wherein at least one of the conductive films includes at least one metal selected from the group consisting of tungsten, molybdenum, manganese, chromium, titanium, zirconium, nickel, iron, silver, copper, platinum, and palladium as a major component.

5. The plasma generating electrode according to claim 1, wherein at least one of the conductive films is disposed inside the ceramic body by screen printing, calendar rolling, spraying, chemical vapor deposition, or physical vapor deposition.

6. A plasma generation device comprising the plasma generating electrode according to claim 1.

7. An exhaust gas purifying device comprising the plasma generation device according to claim 6 and a catalyst, the plasma generation device and the catalyst being disposed in an exhaust system of an internal combustion engine.

8. A plasma generating electrode comprising at least a pair of electrodes disposed opposite to each other and capable of generating plasma upon application of voltage between the electrodes, at least one of the pair of electrodes including a plate-shaped ceramic body as a dielectric and at least one conductive film disposed inside the ceramic body and having a plurality of through-holes formed through the conductive film in its thickness direction in two or more different arrangement patterns, the through-holes having a cross-sectional shape including an arc shape along a plane perpendicular to the thickness direction, the plasma generating electrode being capable of simultaneously generating different states of plasma upon application of voltage between the pair of electrodes due to the different arrangement patterns of the through-holes in the conductive film in the at least one of the pair of electrodes.

9. The plasma generating electrode according to claim 8, wherein the through-holes have a circular cross-sectional shape along the plane perpendicular to the thickness direction.

10. The plasma generating electrode according to claim 8, wherein the at least one conductive film includes a plurality of conductive films, and at least one of the conductive films includes a metal differing from that of another conductive film as a major component.

11. The plasma generating electrode according to claim 8, wherein the at least one conductive film includes at least one metal selected from the group consisting of tungsten, molybdenum, manganese, chromium, titanium, zirconium, nickel, iron, silver, copper, platinum, and palladium as a major component.

12. The plasma generating electrode according to claim 8, wherein the at least one conductive film is disposed inside the ceramic body by screen printing, calendar rolling, spraying, chemical vapor deposition, or physical vapor deposition.

13. A plasma generation device comprising the plasma generating electrode according to claim 8.

14. An exhaust gas purifying device comprising the plasma generation device according to claim 13 and a catalyst, the plasma generation device and the catalyst being disposed in an exhaust system of an internal combustion engine.

* * * * *